(12) United States Patent
Mazur et al.

(10) Patent No.: US 7,691,250 B2
(45) Date of Patent: Apr. 6, 2010

(54) MEMBRANE-MEDIATED ELECTROPOLISHING WITH TOPOGRAPHICALLY PATTERNED MEMBRANES

(75) Inventors: Stephen Mazur, Wilmington, DE (US); Charles E. Jackson, Middletown, DE (US); Gary W. Foggin, Wilmington, DE (US)

(73) Assignee: E.I. Du Pont de Nemours and Company, Wilmington, DE (US)

(*) Notice: Subject to any disclaimer, the term of this patent is extended or adjusted under 35 U.S.C. 154(b) by 1013 days.

(21) Appl. No.: 11/413,367

(22) Filed: Apr. 28, 2006

(65) Prior Publication Data
US 2006/0260952 A1 Nov. 23, 2006

Related U.S. Application Data

(60) Provisional application No. 60/676,338, filed on Apr. 29, 2005.

(51) Int. Cl.
*B23H 3/00* (2006.01)
*C25D 17/00* (2006.01)
*C25B 9/08* (2006.01)

(52) U.S. Cl. .................. 205/668; 204/224 M; 204/237; 204/252

(58) Field of Classification Search ............... 205/668; 204/224 M, 237, 252
See application file for complete search history.

(56) References Cited

U.S. PATENT DOCUMENTS 6,722,950 B1  4/2004  Dabral et al.
7,422,677 B2 *  9/2008  Mazur et al. ................ 205/662
7,566,385 B2 *  7/2009  Mazur et al. ............ 204/224 M
2004/0256237 A1  12/2004  Kobata et al.

FOREIGN PATENT DOCUMENTS

| WO | 03/046263 A1 | 6/2003 |
| WO | 2004/041467 A1 | 5/2004 |
| WO | 2005/042810 A2 | 5/2005 |
| WO | 2005/083159 A2 | 9/2005 |

OTHER PUBLICATIONS

U.S. Appl. No. 60/546,192, filed Feb. 23, 2004, Mazur et al.
U.S. Appl. No. 60/546,198, filed Feb. 23, 2004, Mazur et al.
U.S. Appl. No. 60/611,699, filed Sep. 22, 2004, Mazur et al.
U.S. Appl. No. 60/570,967, filed May 14, 2005, Mazur et al.
D.E. Ward, Electoplating Engineering Handbook, 1984, pp. 100-120, 4th Edition, L.J. Durney, Ed., Van Nostrand Co., NY (Book Not Included).
International Search Report Dated Sep. 22, 2006 for International Application No. PCT/US2006/016338.

* cited by examiner

*Primary Examiner*—Harry D Wilkins, III
*Assistant Examiner*—Nicholas A. Smith
(74) *Attorney, Agent, or Firm*—Gail D. Tanzer

(57) ABSTRACT

This invention provides membrane-mediated electropolishing (MMEP) processes for polishing and/or planarizing metal work pieces using topographically patterned membranes. The processes can be used for both pure metals and alloys, and provide advantages over conventional electropolishing processes and known MMEP processes using smooth membranes. This invention also provides a cathode half-cell and an apparatus useful in membrane-mediated electropolishing processes. The invention also provides processes for electroengraving and electromachining topographic patterns, holes and/or grooves into the surface of a metal work piece.

22 Claims, 11 Drawing Sheets

US 7,691,250 B2

MEMBRANE-MEDIATED ELECTROPOLISHING WITH TOPOGRAPHICALLY PATTERNED MEMBRANES

This Application claims priority to U.S. provisional application No. 60/676,338, filed on Apr. 29, 2005.

FIELD OF THE INVENTION

This invention relates to a process for polishing metal surfaces, and more specifically to an electropolishing process, wherein a portion of metal is removed from the surface by electrochemical anodic oxidation.

BACKGROUND OF THE INVENTION

Conventional electropolishing (EP) is a common metal finishing process in which the metal object to be polished (the "work-piece") is connected to the positive terminal of a DC electrical power supply as the anode. The surface of the work-piece or some portion of that surface is brought into contact with an electrolyte solution, which, in turn, also contacts a second electrode (the cathode), which is connected to the negative terminal of the power supply. When a suitable voltage difference is applied between the two electrodes, or a suitable current density is established at the anode, then the work-piece undergoes anodic oxidation forming solvated metal ions that dissolve into the electrolyte. Within a certain range of operating conditions this occurs in such a way that rough areas of the surface become smoother. In this context, current density is defined as the electrical current per unit surface area of cathode in contact with the electrolyte and has units such as $mA/cm^2$.

EP is capable of producing a mirror-like reflective finish on many different kinds of metals and is especially useful for polishing metal parts with curved surfaces and complicated shapes. Recent interest has focused on the use of EP to selectively remove excess copper in the fabrication of integrated circuits via the copper damascene process.

Planarization and removal of excess copper from Cu damascene wafers is currently achieved by chemical-mechanical polishing (CMP), involving mechanical abrasion and chemical reactions with oxidizers and other chemicals. However, CMP is a costly process, generates hazardous waste products, and is incompatible with the mechanically fragile materials currently under development for improved dielectric layers.

Alternate approaches to planarization have been disclosed by S. Mazur et al., (co-pending applications U.S. Ser. No. 60/546,192; U.S. Ser. No. 60/546,198; U.S. Ser. No. 60/611,699; and U.S. Ser. No. 60/570,967) and by S. Dabrai et al. (U.S. Pat. No. 6,722,950). These references are incorporated herein in their entirety.

While these methods provide improvements over conventional CMP and standard EP, there remains a need for a planarization process that is effective over a wide range of operating conditions. In particular, it is of interest to maximize the current density while minimizing the voltage, and to reduce the sensitivity of the current density to interfacial velocity and to interfacial pressure between the membrane and the work-piece.

SUMMARY OF THE INVENTION

One aspect of the present invention is a membrane-mediated electropolishing process comprising:
  a. providing a cathode half-cell comprising:
    1. a fully or partially enclosed volume, cavity or vessel;
    2. an electrolyte solution or gel that partially or substantially fills the enclosed volume, cavity or vessel;
    3. an electrode in contact with the electrolyte solution or gel;
    4. a means for electrically connecting the electrode to a DC power source; and
    5. a charge-selective ion-conducting membrane that seals one surface of the enclosed volume, cavity or vessel in such a way that the internal surface of said membrane contacts the electrolyte solution or gel and the external surface is accessible to contact the metal work piece and a low-conductivity solvent or solution, and wherein the membrane is topographically patterned with lands of width $W_L$ and channels of depth $D_C$ situated on the external surface of the membrane, and the channels extend to the edges of the contour area;
  b. substantially covering a surface of a metal work piece with the low-conductivity solvent or solution;
  c. providing a source of DC electrical power whose positive terminal is connected to the metal work piece and whose negative terminal is connected to the electrode in the half-cell; and
  d. contacting the metal work piece with at least a portion of the external surface of the membrane.

Another aspect of the present invention is an apparatus for use in membrane-mediated electropolishing of a metal work piece, comprising:
  a. a DC electric power source;
  b. a means for electrically connecting the work piece to the positive terminal of the DC electric power source;
  c. an electrolyte solution or gel;
  d. a low conductivity solvent or solution in contact with the membrane and the work piece;
  e. a charge-selective ion-conducting membrane that seals one surface of the enclosed volume, cavity or vessel in such a way that the internal surface of said membrane contacts the electrolyte solution or gel and the external surface is accessible to contact the metal work piece and a low-conductivity solvent or solution, and wherein the membrane is topographically patterned with lands of width $W_L$ and channels of depth $D_C$ situated on the external surface of the membrane, and the channels extend to the edges of the contour area;
  f. a cathode in contact with the electrolyte solution or gel;
  g. a means for connecting the cathode to the negative terminal of the DC electric power source; and
  h. a means for moving the membrane in contact with the work piece and the low-conductivity solvent or solution along the surface of the work piece.

A further aspect of the present invention is a cathode half-cell for use in membrane-mediated electropolishing, comprising:
  a. a fully or partially enclosed volume, cavity or vessel;
  b. an electrolyte solution or gel that partially or substantially fills the enclosed volume, cavity or vessel;
  c. an electrode in contact with the electrolyte solution or gel;
  d. a charge-selective ion-conducting membrane that seals at least one surface of the enclosed volume, cavity or vessel, wherein the internal surface of the membrane is in contact with the electrolyte solution or gel, and wherein the membrane is topographically patterned with lands of width $W_L$ and channels of depth $D_C$ situated on the external surface of the membrane, and the channels extend to the edges of the contour area.

DETAILED DESCRIPTION OF THE INVENTION

Figure 1:
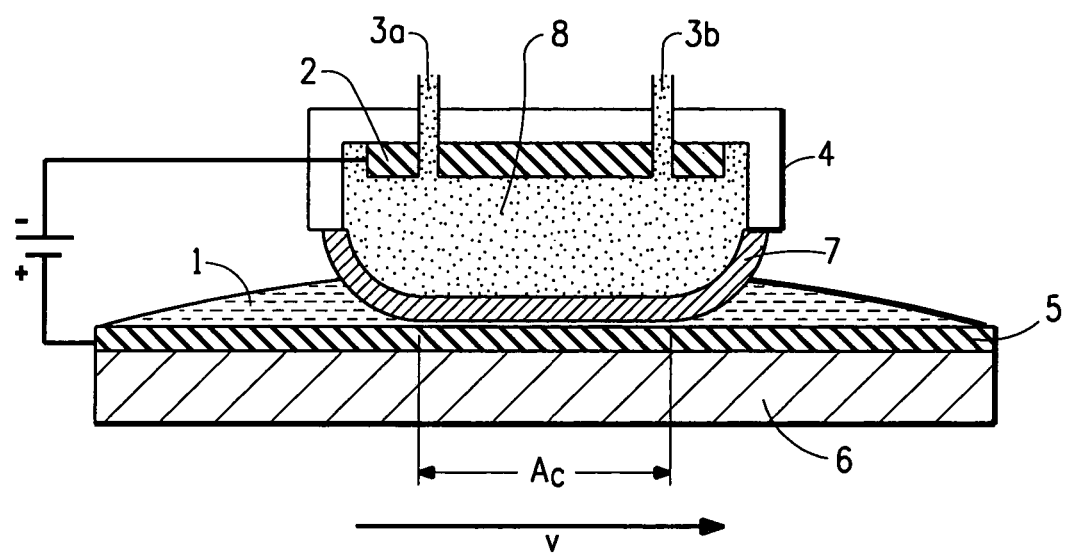
FIG. 1 is a schematic diagram of the MMEP process.

The present invention provides a new type of EP process whereby the work piece is physically separated from the electrolyte and cathode by a charge-selective ion-conducting membrane, and wherein the membrane is substantially impermeable to the electrolyte but permeable to the ions produced by anodic oxidation of the work piece. The process, referred to herein as a membrane-mediated electropolishing process (MMEP) is distinguished from conventional EP in that, in the present process, the work piece does not contact the electrolyte. As described in co-pending applications (U.S. Ser. No. 60/546,192; U.S. Ser. No. 60/546,198; U.S. Ser. No. 60/611,699; and U.S. Ser. No. 60/570,967), MMEP can efficiently planarize surface features with lateral dimensions of 100 μm and is therefore useful for the fabrication of Cu interconnects on integrated circuits.

Conventional EP of Cu in acid electrolyte solutions is generally carried out at anodic current densities, I, between 0.2 and 1 amp/cm². The removal rate of Cu, expressed as the thickness loss per unit time is given by:

$$RR = (I/n)(V_m/F)$$

where $V_m$ is the molar volume of Cu (7.13 cm³/mole), F is Faraday's number (96,500 coulombs/mole), and n is the number of electrons required to remove one atom of Cu. When the formation of $Cu^{+2}$ ions is the only anodic reaction, n=2; but at high current densities, other anodic reactions, such as oxidation of water generally also occur, so that n typically exceeds 2. For example, an EP process with I=1 amp/cm² and n=3, could provide RR=15 μm/minute. In comparison, CMP processes presently used to planarize Cu interconnects on integrated circuits cannot achieve removal rates greater than about 0.8 μm/min. As described in co-pending applications (U.S. Ser. No. 60/546,192; U.S. Ser. No. 60/546,198; U.S. Ser. No. 60/611,699; and U.S. Ser. No. 60/570,967), the MMEP process can be carried out with I=2 amp/cm² with n=7, corresponding to RR=13 μm/minute.

The present invention provides improved performance in an MMEP process by allowing an increase in I without increasing n so as to achieve higher removal rates than is achievable by conventional EP or by MMEP with conventional smooth membranes.

In the processes disclosed herein, a cathode half-cell is used, which can be a fully or partially enclosed volume, cavity or vessel. The half-cell contains an electrode in contact with an electrolyte solution or gel, and is sealed on at least one surface with a charge-selective ion-conducting membrane. The electrolyte solution or gel at least partially, preferably substantially, fills the enclosed volume, cavity or vessel. By "substantially fills" is meant that at least about 85 percent, preferably at least about 90 percent, more preferably at least about 95 percent, and even more preferably at least about 99 percent, of the enclosed volume, cavity or vessel is filled by the electrolyte solution or gel. Preferably, the electrolyte in the half-cell is maintained at a hydrostatic pressure greater than ambient atmospheric pressure, and the membrane is sufficiently flexible to expand under the influence of this pressure to establish a convex external surface (called a "bulge" or "blister") extending beyond adjacent surfaces of the half-cell to contact the work piece. A source of DC electrical power is connected between the work piece (which functions as the anode) and the electrode in the cell (which functions as the cathode). Polishing is accomplished when a portion of the external surface of the ion-conducting membrane is pressed against a portion of the work piece otherwise covered by the low-conductivity solvent, and the interfacial area is moved across the surface of the work piece. In some embodiments of the process, the metal work piece and the membrane of the cathode half-cell are moved relative to each other such that the area of contact of the membrane moves across a surface of the metal work piece. In many applications of this process, in moving the metal work-piece and the membrane relative to each other, the work-piece can be held stationary and the membrane moved across its surface, or the half-cell can be held stationary and the work-piece moved, or both the work piece and the half-cell can be in motion, provided that the area of contact is not static. "Low conductivity", as used herein, means a conductivity preferably 200 mS/cm (mS=milliSiemens) or less. Preferably the conductivity is less than 100 mS/cm.—When a suitable voltage is applied between the anode and cathode under these conditions, some of the metal becomes oxidized to form solvated metal ions that migrate across the membrane into the half-cell.

One embodiment of an MMEP process according to the present invention is illustrated schematically in FIG. 1. The work-piece comprises, for example, a layer 5 of metal such as copper supported on a semiconductor substrate 6. The metal surface is covered by, for example, de-ionized water 1. The cathode half-cell 4 comprises a partially enclosed volume containing a metal cathode 2 and is filled by an electrolyte solution 8 that is continuously circulated from a reservoir (not shown) via ports 3*a* and 3*b*. A charge-selective ion-conducting membrane 7 seals an opening in the half-cell 4. The internal surface of the membrane contacts the electrolyte solution. Hydrostatic pressure within the half-cell causes the membrane to expand so that its external surface forms a uniform convex "blister". When the external surface of this blister is pressed against the surface of the work-piece, a contour area $A_c$ is created within which the membrane surface is substantially flattened by the balance between interfacial pressure and hydrostatic pressure. When the work-piece and cathode are connected respectively to the positive and negative terminals of an electrical power supply at sufficient voltage to anodically oxidize the work-piece, a Faradaic current is carried by the anodically generated cations through the membrane. In order to polish and planarize the work-piece, it is also desirable to maintain a relative velocity v between the surfaces of the work piece and the membrane while the Faradaic current is flowing. FIG. 1 represents only one of a variety of possible configurations that can be used in the processes of the invention.

In the MMEP processes disclosed herein, the external surface of the membrane used in the cathode half-cell is topographically patterned to create a plurality of "lands", locally projecting substantially flat areas, surrounded by locally recessed channels that extend to the edges of the contour area $A_c$. The use of such membranes provides an MMEP process that can be carried out at increased current density and removal rate at a given voltage, while maintaining high planarization efficiency. In addition, the present invention provides methods for reducing the sensitivity of current density to variations in interfacial velocity and interfacial pressure between membrane and work-piece that has been observed when MMEP is carried out using smooth membranes. Yet another aspect of the invention is that it provides methods to achieve high current densities substantially independent of the size of the contour area $A_c$, so that without sacrificing current density this area may be arbitrarily large, for example equal to the total area of the work piece.

Figure 2:
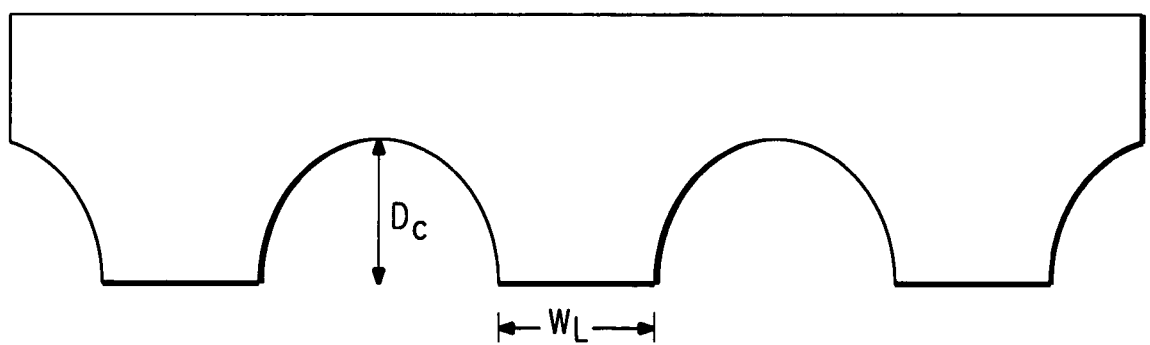
FIG. 2 is a schematic cross-section of a topographically patterned membrane showing land width $W_L$ and channel depth $D_C$.

FIG. 2 shows an example of the cross-section of a topographically patterned membrane for use in the processes disclosed herein, where $W_L$ and $D^C$ represent respectively the width of lands and depth of channels situated on the external (lower) surface of the membrane. In the example shown the internal (upper) surface of the membrane is smooth (without topographic pattern), but this is not essential. For use in the present invention, $W_L$ of the patterned membrane is typically less than 10 mm in one or both dimensions parallel to the interface, preferably less than 2 mm in one or both dimensions parallel to the interface. The channels are typically of depth $D_C$ greater than 1 μm, preferably greater than 5 μm, and extend to the edges of the contour area. The lands can be surrounded on at least two sides, preferably on all sides, by channels that extend to the edges of the contour area.

In one embodiment of an MMEP process of this invention, the topographic pattern of the membrane comprises a plurality of locally projecting, substantially flat lands less than 1.0 cm$^2$ in area, preferably less than 0.01 cm$^2$ in area, surrounded by locally recessed channels more than 1 μm deep, preferably more than 5 μm deep, where the channels extend to the edges of the contour area.

A convenient way to prepare a topographically patterned membrane for use in the invention is to permanently emboss the desired pattern into the surface of a pre-existing smooth membrane. The embossing tool may consist of a screen, grid, mesh, pierced, porous, or woven sheet or expanded lattice composed of metal, glass, polymeric or natural fibers or any other material sufficiently hard to permanently deform the surface of the membrane when the two surfaces are pressed together under a suitable combination of temperature and pressure. The topographic pattern embossed into the membrane surface in this way corresponds to a cast of the embossing tool. In this, or any other operation, it is highly desirable that no holes or tears occur which would compromise the ability of the membrane to serve as a barrier between the electrolyte solution and low-conductivity solvent or solution.

Using different sizes of wire mesh and different types of embossing tools, the same method can be used to prepare topographically patterned embossed membranes with wide variations in the land area and fractional coverage. While embossing is a simple and inexpensive method for creating topographically patterned membranes, the invention is not limited to embossed membranes and other methods for creating the desired topography will be apparent to those skilled in the art.

In addition to be being topographically patterned on the external surface, the membrane is preferably substantially impermeable to the electrolyte in order to maintain the low-conductivity of the solvent or solution covering the anode. On the other hand, in order to maintain sufficient Faradaic current for the polishing process, the membrane is desirably permeable by the solvated or complexed metal ions produced in anodic oxidation of the work piece. If the ions are positively charged, then the membrane is desirably a cation-conducting membrane. Similarly, under conditions where anodic oxidation produces a complex metal anion, an anion-conducting membrane is suitable.

Charge-selective ion-conducting membranes are generally solid organic polymers that bear covalently bound ionic functional groups. The bound ions constitute fixed charges that are balanced by unbound, mobile counter-ions of the opposite charge. The latter may diffuse within the membrane or migrate under the influence of an electric field to carry electric current. Small ions in adjacent solutions with the same sign as the mobile counter-ions exchange readily with those in the membrane. By contrast, ions in adjacent solution with the same charge as the fixed ions in the membrane tend to be excluded from such membranes due to electrostatic repulsion. Thus, all charge-selective ion-conducting membranes are more or less impermeable to electrolyte solutions due to exclusion of ions that share the same sign as the fixed charges.

Suitable charge-selective ion-conducting membranes include film-forming ionic polymers that are stable under the conditions of the electropolishing process. Ionic polymers useful as fuel-cell membranes may also be useful in this membrane-mediated electropolishing process. A preferred class of membranes is cation-conducting membranes, especially those formed from polymeric ionomers functionalized with strong acid groups, i.e., acid groups with a pKa of less than 3. Sulfonic acid groups are preferred strong acid groups. Preferred polymeric ionomers are copolymers of fluorinated and/or perfluorinated olefins and monomers containing strong acid groups.

To the extent that such charge-selective ion-conducting membranes transport only ions of one sign, contamination of the work piece and low-conductivity solvent by electrolyte is prevented. Also, since the only source of mobile ions on the anode side of the membrane is the anodic oxidation reactions, substantially all of the current will be carried by ions produced at the anode. Consequently, these ions are automatically absorbed and transported through the membrane and removed from work piece at exactly the same rate as they are produced, thereby eliminating a second source of contamination.

Nafion® perfluorosulfonate ionomer membranes (E.I. du Pont de Nemours and Company, Wilmington, Del.) are composed of fluorocarbon chains bearing highly acidic sulfonic acid groups. On exposure to water, the acid groups ionize, leaving fixed sulfonate anions and mobile hydrated protons. The protons may be readily exchanged with various metal cations. Nafion® is particularly well-suited for use in MMEP due to its strong common-ion exclusion, high conductivity, strong acidity, chemical stability and robust mechanical properties. Also, Nafion® membranes are easily patterned by common thermoforming techniques.

MMEP polishing of Cu in water is typically done in an acidic environment at the surface of the anode because at pH>4 $Cu^{+2}$ precipitates from water as CuO or $Cu(OH)_2$. Nafion® provides the necessary acidic environment to solubilize $Cu^{+2}$.

Most charge-selective ion-conducting membranes, including Nafion®, require solvation by a polar solvent such as water to support ion conductivity. The conductivity of fully hydrated Nafion® N117H membrane is approximately 0.1 S/cm, but it decreases by orders of magnitude when the water content falls below a critical value. This turns out to have important consequences for the MMEP process.

When a Cu work piece was immersed in water with a static interface (i.e., v=0), the Faradaic current decreased drastically within seconds after application of voltage and the membrane developed a strong adhesion to the work piece that persisted for as long as the current was allowed to flow. Moreover, membrane-mediated anodic oxidation at this static interface was found to be largely restricted to the periphery of the contour area.

These effects are believed to be a consequence of electro-osmotic membrane dehydration. Since each $Cu^{+2}$ ion is solvated by 4 to 6 water molecules, transport of $Cu^{+2}$ ions also removes water from the membrane. In regions of the membrane near the center of the contour area, where diffusion of water from the surrounding bath is not sufficient to replenish the water supply, the membrane may become sufficiently dehydrated to stop carrying current. At the same time, the dehydrated membrane adheres tenaciously to the dry Cu surface. Although detrimental to most polishing applications, this phenomenon provides a convenient method to visualize and measure the contour area. Thus, when the membrane is removed following a brief period of membrane-mediated anodic oxidation across a static (non-moving) interface, the periphery of the contour area becomes clearly visible as a sharply defined narrow line etched into the surface of the work-piece, while little or no etching occurs in the center of the contour area. This phenomenon is illustrated in FIGS. 3 and 4.

This static etching procedure can be used to visualize and measure the dimensions of the contour area $A_c$, and also to visualize and measure the dimension of much smaller interface areas $A_i$ associated with topographically patterned membranes.

When using topographically patterned membranes in the present invention, current flow and anodic oxidation of the work piece are limited to its interface with the lands on the membrane's external surface because the depth of the channels $D_C$ creates too large an electrical resistance to permit significant flow of current. Consequently the electrochemically active interface area $A_i$ is less than the total contour area $A_c$. This distinction is demonstrated by FIGS. 4A and 4B, which show a micrograph of the static etch pattern produced by a topographically patterned membrane comprised of square lands approximately 1 mm wide separated by channels approximately 0.2 mm wide. It can be seen that static etching has been concentrated on the periphery of the lands, with no discernable etching within the channels (or in the center of most lands). The etch pattern extends over a roughly circular area approximately 12 mm in diameter corresponding to a contour area $A_c$=1.13 cm$^2$. From the etch pattern, the average area of the lands was found to be $1.4 \times 10^{-2}$ cm$^2$, while the fraction of contour area within the lands $F_L$ was found to be 0.56, corresponding to an active interface area $A_i$=0.63 cm$^2$.

Static etching does not planarize the work piece and is therefore not useful for polishing Cu interconnects on wafers for the electronic industry. Etching patterns into the metal surface is generally an undesirable outcome and is usually to be avoided. However, it has been found that by constantly moving the contour area across the surface of the work piece in a "sweeping" or "rubbing" motion, a stable Faradaic current can be maintained and uniform planarization can be achieved, while adhesion of the membrane and etching patterns into the metal surface can be avoided.

It is believed that this movement of the interface provides a flux of water to the interfacial area via a hydrodynamic mechanism similar to fluid lubrication of solid surfaces. So long as this hydrodynamic flux of water to the interface exceeds or equals the electro-osmotic flux of water away from the interface, the membrane retains sufficient water to carry Faradaic current to any area of the work-piece within some maximum distance determined by the conductivity and thickness of interfacial water, and by the applied voltage.

When the electro-osmotic flux begins to compete with the hydrodynamic flux the interfacial water layer may become thinner, resulting in an increase the coefficient of friction. This increase can be observed experimentally when the Faradaic current is systematically increased at constant interface velocity and interface pressure. In the limit when electro-osmotic flux exceeds the hydrodynamic flux, areas towards the center of the interface may become partially dehydrated, causing a local decrease in Faradaic current and adhesion of the membrane. For example, with smooth membranes at constant applied voltage, the Faradaic current ceases to be proportional to the contour area when the interface velocity is systematically decreased below a certain limit. At still lower velocity, the current begins to decrease, and the onset of adhesion is ultimately indicated by an audible squeaking noise and severe abrasion of the membrane.

In general, current density represents an electrical current averaged over some area. Just as it is important in the present context to distinguish between the total contour area $A_c$ and the active interfacial area $A_i$, a similar distinction is made in describing current densities. As defined herein, the average current density, $I_c$, is the ratio of the total Faradaic current i to the total contour area, $I_c=i/A_c$. It is not presumed that the total current i is necessarily proportional to $A_c$, nor that current is uniformly distributed within the contour area. Thus systematic variations in $I_c$ with $A_c$ may be regarded as indicating a non-uniform distribution of current, whereas a constant value of $I_c$ independent of $A_c$ is a necessary, but not sufficient, condition for uniform distribution within the contour area. Similarly, the ratio of the total Faradaic current i to the active interface area is defined as the interfacial current density $I_i=i/A_i$. For topographically patterned membranes of the present invention $I_i=I_cF_L$, where $F_L$ is the fraction of contour area on the lands.

The hydrostatic pressure $P_h$ of the electrolyte determines the interfacial pressure between membrane and work-piece that may influence the thickness of the interfacial water layer.

Based on analogy with the mechanics of fluid lubrication, one might expect for a smooth membrane at sufficiently high velocity to avoid electro-osmotic dehydration that the interfacial water thickness should decrease with increasing $P_h$. This expectation is consistent with experimental observations as illustrated by the data in FIG. 8.

The low-conductivity solvent or solution used in MMEP contacts both the anode and the external surface of the membrane. The solvent (or solution) serves to solvate the metal ions and facilitate their transport through the membrane, and also to limit the anodic dissolution reaction to areas of the work piece in contact with, or in close proximity to, the membrane. To so limit the anodic dissolution reaction, the electrical conductivity of the solvent or solution is preferably less than 500 μS/cm. For example, at a conductivity of 1 μS/cm, a 1 cm$^2$ area of the anode more distant from the membrane than 1 μm would be effectively "protected" by a series resistance of 100 ohms relative to another 1 cm$^2$ area that contacts the membrane. This is sufficient to suppress the rate of oxidation of Cu at <10 V over potential. To satisfy the solubility condition, the solvent or some component of the solution is desirably capable of solvating or otherwise coordinating the metal ions produced at the anode to create an ionic complex that is soluble and mobile within the membrane. The nature of the anode reaction may also be influenced by the composition of the low-conductivity solvent in other ways. For example, when MMEP is used to polish Cu in contact with deionized water, dissolution occurs via 2-electron oxidation to $Cu^{+2}$. However, when the same process is repeated using aqueous acetonitrile, which is known to stabilize $Cu^{+1}$, the amount of Cu removed per coulomb of charge passed increases by a factor of 2, indicating 1-electron oxidation to $Cu^{+1}$. In some instances, it is preferable to use a very dilute aqueous acid solution as the low conductivity solution rather than deionized water.

For many typical anode compositions suitable for use in MMEP, corresponding suitable choices for cathode and electrolyte compositions can be found in "Electroplating Engineering Handbook", 4$^{th}$ Edition, pp. 100-120, by D. E. Ward, L. J. Durney, Ed., Van Nostrand Co., NY, 1984. Suitable cathode and electrolyte compositions include $Cu/CuSO_4$, $Ag/AgNO_3$, and $Sn/SnCl_2$. The electrolyte is chosen to provide high solubility for the metal ions or coordinated metal ions produced by oxidation of the anode, and desirably has sufficiently high conductivity to carry current densities up to several hundred mA/cm$^2$ without introducing significant voltage drop or heating. Conductivities of at least 100 mS/cm are preferred. The most common EP electrolytes are concentrated aqueous solutions of strong acids.

The cathode can be made from any electrically conductive material that is chemically stable in the electrolyte. Suitable examples of cathode materials include Cu, C, Ni, steel, and brass. During polishing one or more reduction reactions may occur at the cathode. For example, in aqueous acids these may include electrolysis of water to liberate hydrogen and the reduction or plating of metal ions derived from the anode. In order to minimize hydrogen evolution relative to plating, metal salts, e.g., $CuSO_4$, can be included in the electrolyte. An example of an electrolyte solution useful for MMEP of Cu is 0.5 M $CuSO_4$ in 1.0 M aqueous $H_2SO_4$.

In conventional EP, where the work piece is totally immersed in electrolyte, metal salts generally are not added because the cost of formulating, recovering and/or disposing of such large volumes of material, would be prohibitive. By contrast, a single MMEP cathode half-cell contains only a few ml of electrolyte and can be used to polish work pieces many times larger in volume. By adding metal ions to the MMEP electrolyte equivalent to those generated at the anode, the electrolyte composition can be maintained constant. That is, when the rate of production of new ions is exactly balanced by the rate at which they are reduced at the cathode, then no hydrogen is generated and, in principle, the same small volume of electrolyte can be re-used indefinitely. Moreover, the electrolyte never directly contacts or contaminates the work piece, eliminating the need for decontamination and disposal of toxic waste products.

The membrane-mediated electropolishing process can be used with a wide variety of metals and metal alloys. Suitable metals include silver, nickel, cobalt, tin, aluminum, copper, lead, tantalum, titanium, iron, chromium, vanadium, manganese, zinc, zirconium, niobium, molybdenum, ruthenium, rhodium, hafnium, tungsten, rhenium, osmium, iridium, or alloys such as brass, lead/tin alloys and steel. Preferred metals include silver, nickel, cobalt, tin, aluminum, copper, lead, and alloys such as brass, steel and lead/tin.

MMEP can be used to polish a variety of metals using strong acid electrolytes in a MMEP cell with a Nafion® membrane. Differences in the coordination chemistry and solubility of different metal ions can dictate the use of different electrolytes for different metals. Chloride ion has been found to be effective in maintaining the solubility of $Sn^{+2}$ and $Al^{+3}$; a few representative examples of electrolytes that can be used for MMEP are listed in the Table.

TABLE

Membrane-mediated Electropolishing of Various Metals and Alloys

| M | Electrolyte | Bath | V | Im A/cm$^2$ | n e/M | Comments |
|---|---|---|---|---|---|---|
| Ag | 2M $HNO_3$ | $H_2O$ | 3.5 | 700-630 | 0.99 | mirror-like finish |
| Ni | 0.3M $CuSO_4$ in $H_2SO_4$, $H_2O$, 1:2 | $H_2O$ | 8.0 | 500-580 | 26 | mirror-like finish $O_2$ evolution |
| Co | 0.3M $CuSO_4$ in $H_2SO_4$, $H_2O$, 1:2 | $H_2O$ | 4 to 10 | 50-500 | 1.09 | black deposit, (colloidal Co?) |
| Co | 0.15M $CuSO_4$ in $H_2SO_4$:$H_2O$:$CH_3CN$ 1.0:1.5:2.5 | $H_2O$ | 2.0 | 210-190 | 1.92 | bright, grainy |
| Sn | 0.3M $CuSO_4$ in $H_2SO_4$, $H_2O$, 1:2 | $H_2O$ | 2.0 | 300-150 | 1.92 | dark grey matte |
| Sn | 0.2M $CuSO_4$ 4M HCl in $H_2SO_4$, $H_2O$ 1:3 | $H_2O$ | 1.0 | 300-140 | 1.99 | mirror-like finish |

TABLE-continued

Membrane-mediated Electropolishing of Various Metals and Alloys

| M | Electrolyte | Bath | V | Im A/cm$^2$ | n e/M | Comments |
|---|---|---|---|---|---|---|
| S. Steel type 316 | 0.3M CuSO$_4$ in H$_2$SO$_4$, H$_2$O 1:2 | H$_2$O | 7.0 | 900-250 | 29 | mirror-like finish O$_2$ evolution |
| Al | 0.15M CuSO$_4$ 5M HCl in H$_2$SO$_4$, H$_2$O 1:4 | H$_2$O | 2 to 4 | 200-600 | 2.64 | hazy mirror-like |

In another embodiment of the MMEP process, a source of strong base or cyanide ion can be used in the electrolyte or in the low-conductivity solution in an anodic generation of complex metal anions such as $Al(OH)_6^{-3}$ or $Fe(CN)_6^{-3}$. Under these conditions, the MMEP process would use an anion-conducting membrane instead of a cation-conducting membrane.

MMEP can provide much higher planarization efficiency than conventional EP in electrolyte solutions. Moreover, for large features with lateral dimension $\lambda$=200 microns, the planarization efficiency of MMEP is much greater than that for the "ideal" EP process, which would use extremely slow polishing with non-convected electrolyte.

While $I_c$>1 amp/cm$^2$ and high removal rates can be obtained by conventional MMEP with smooth membranes at applied voltages >10V, these conditions are not compatible with high planarization efficiency. As described in the co-pending applications by Mazur et al., the planarization efficiency of MMEP was found to be enhanced by periodically switching the voltage between low and high positive values so that the average current density alternated respectively between 0 and some greater value. For example, an MMEP process using a smooth membrane and voltage "pulses" alternating between 55 msec at 7 V and 8 msec at 0 V, successfully planarized features with 100 µm lateral dimensions and an initial step height of 1 µm. For this process $I_c$ was ~0.2 amp/cm$^2$ and n~4, corresponding to an interfacial removal rate within the interfacial area RR$_1$~2 µm/min. Therefore to achieve RR>1 µm/min over the entire surface of the work-piece could require a contour area or plurality of contour areas >50% of the area of the work-piece.

In one respect the present invention provides a process for MMEP to achieve RR>1 µm/min over the entire surface of the work-piece with a contour area or plurality of contour areas <50% of the area of the work-piece. The net removal rate equals the removal rate within the contour area times the ratio of the contour area to the total area of the work piece. Achieving efficient planarization with smooth membranes requires pulsing the current which reduces removal rate within the contour area.

The advantages of MMEP over EP have been described in the cited co-pending applications by Mazur et al. As described herein and demonstrated by the examples, the use of topographically patterned membranes can provide advantages and improvements in the MMEP process over and above the performance achieved with smooth membranes. Examples of such advantages that can be achieved include: 1) Higher current densities and removal rates at lower voltages than by the use of smooth membranes; 2) High current densities and removal rates can be maintained independent of contour area; 3) Current densities are much less sensitive to interface velocity and hydrostatic pressure than with smooth membranes; 4) High planarization efficiency at average current density >1 amp/cm$^2$; and 5) High planarization efficiency at interfacial removal rates >2 µm/min.

Figure 4A:
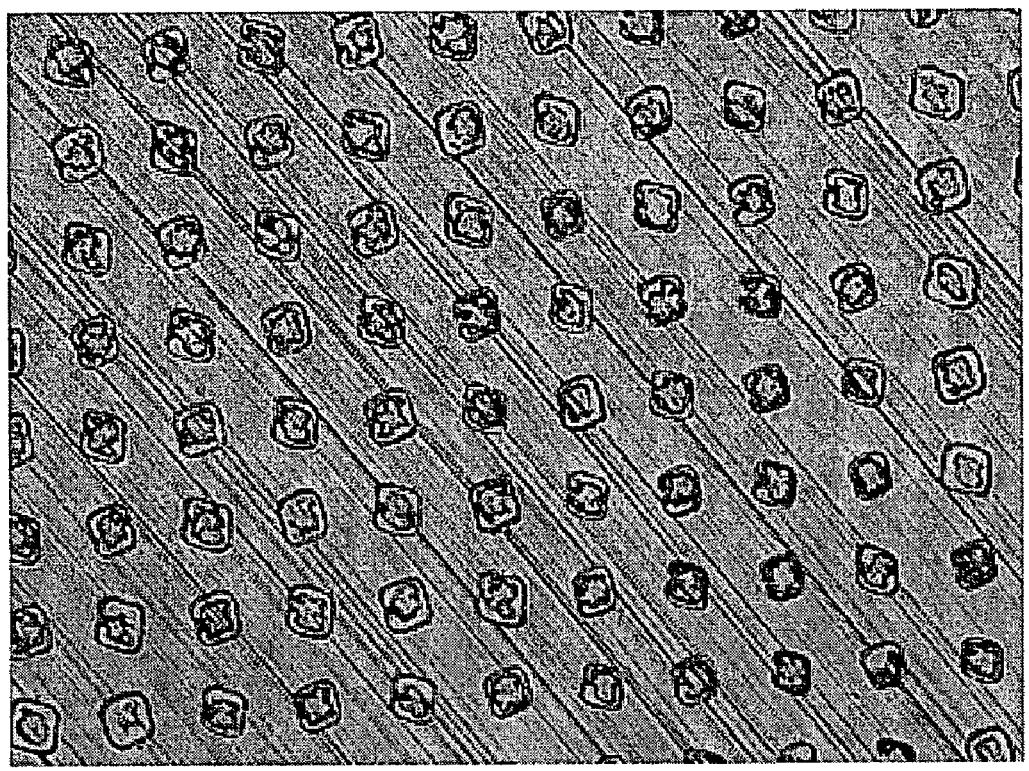
FIG. 4A is a dark field optical micrograph of the static etch pattern created by the membrane of FIG. 3A.
Figure 4B:
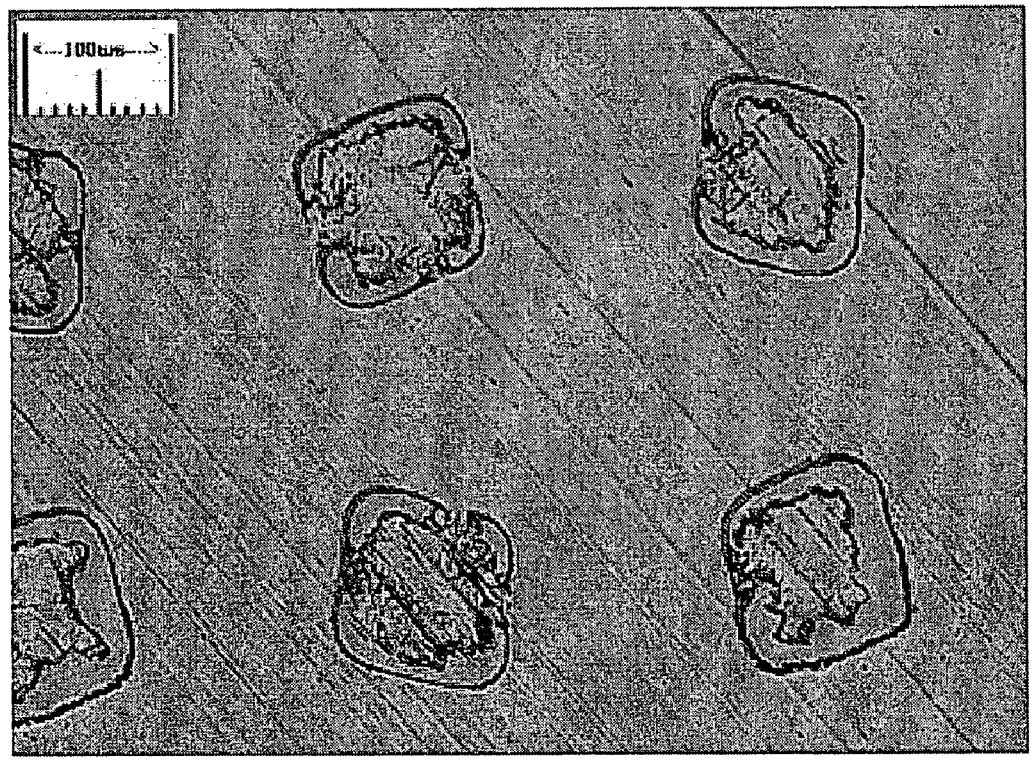
FIG. 4B is an enlarged view of a portion of FIG. 4A.
Figure 5:
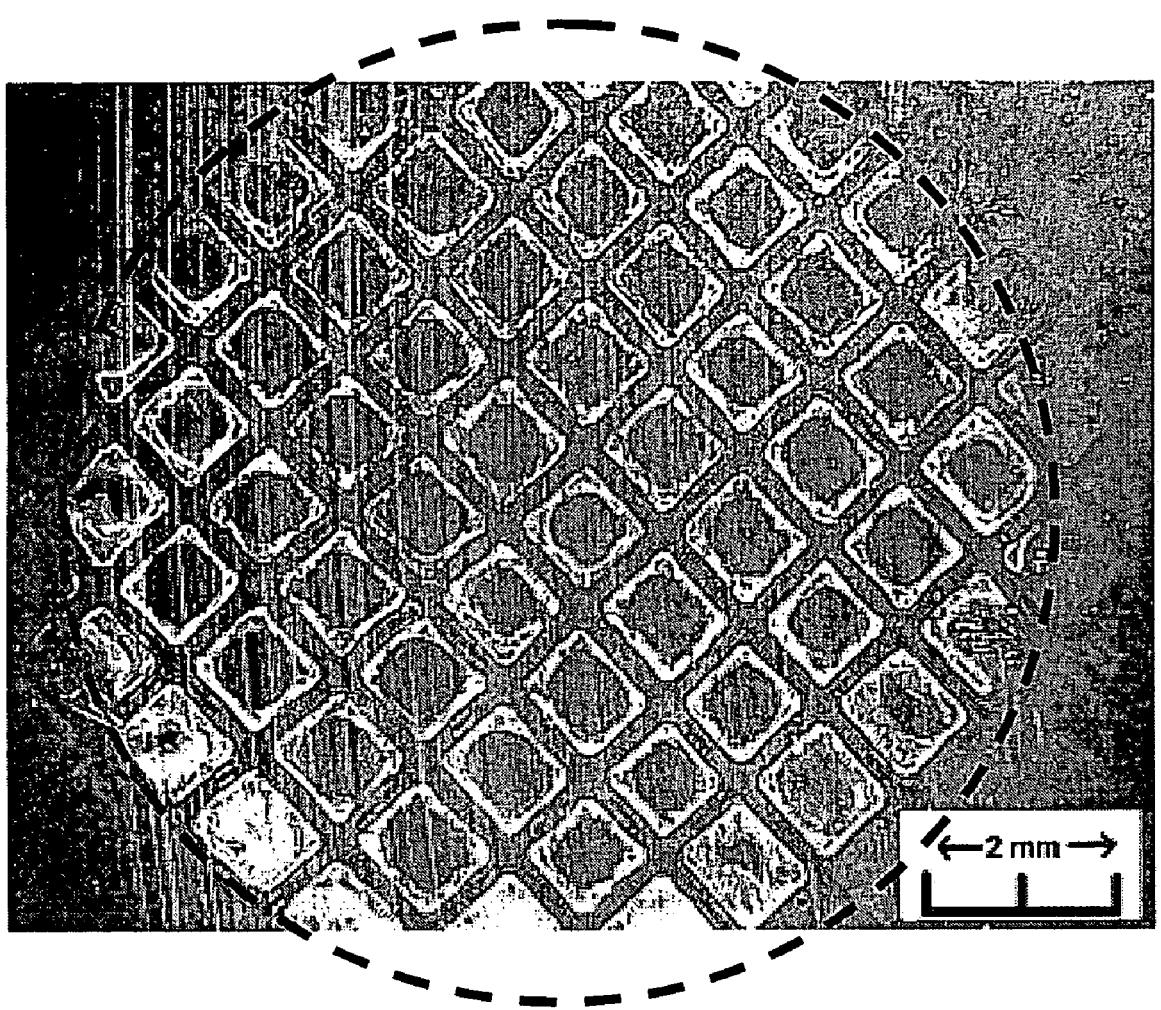
FIG. 5 is a dark field optical micrograph of the static etch pattern created by an embossed membrane, where the membrane contour area $A_c$ is indicated by dashed circle and the interface area of single land $A_i$ is bounded by the white square.

As demonstrated by FIGS. 4 and 5, static etching using a topographically patterned membrane precisely reproduces the pattern of lands on the membrane as a pattern of etched pits in the work-piece. This process can be very rapid. For example, it was found that static etching can completely remove a 1 µm layer of Cu from the periphery of the lands within seconds, or etch holes through an 18 µm thick Cu foil in several minutes. Thus a topographically patterned membrane fitted in a cathode half-cell could be used to electro-engrave patterns onto metal surfaces or electro-machine holes or grooves corresponding to the pattern of lands on the membrane. These processes differ from MMEP in that the interface remains static (v=0). However, it is also possible to electro-engrave or electro-machine precise grooves by moving the lands over the surface of the work-piece in a well-controlled manner. Moreover, the depth, trajectory, beginning and end of these groves can be controlled by suitable control of the trajectory and residence time of the membrane as well as the applied voltage. The maximum depth of holes or grooves that can be engraved or machined by the process is limited by the depth of channels $D_L$ in the topographically patterned membrane.

Applications for membrane-mediated electroengraving and electromachining include fabrication of decorative surfaces and electrical circuits on printed wiring boards.

In another respect, aside from MMEP, the topographically patterned membranes also can facilitate electrochemically engraving and electrochemically machining topographic patterns, holes and/or grooves in a metal work piece.

EXAMPLES

Nafion® PFSA membranes (N112, N115, N117, and NE1135, E. I. DuPont de Nemours and Company, Wilmington, Del.) are non-reinforced films based on Nafion® PFSA polymer, a perfluorosulfonic acid/PTFE copolymer in the acid (H+) form.

Copper coupons (0.016" thick, 110 alloy, 99.9%) were obtained from McMaster-Carr Supply Co., New Brunswick, N.J. Test wafers coated with either damascene patterned or un-patterned electrodeposited Cu were obtained from Sematech International (Austin, Tex.).

All MMEP experiments were performed on circular work pieces 200 mm in diameter using a specially designed apparatus. The work piece (either a copper coupon or a test wafer) was held facing up on a circular turntable by use of a vacuum chuck. The cathode half-cell with membrane blister facing down was mounted to a low-friction bearing allowing free vertical motion but no horizontal motion. The bearing was mounted on a motorized rail allowing the half-cell to be moved to any radial distance from the center of the work-piece. 80 ml of electrolyte solution (0.5M CuSO$_4$ in 1.0 M H$_2$SO$_4$) was continuously re-circulated from a remote reservoir through the half-cell by a peristaltic pump (Masterflex #7523-00) connected with PTFE (polytetrafluoroethylene) tubing. Hydrostatic pressure P$_h$ was measured by a transducer also connected to the half-cell with PTFE tubing. Hydrostatic pressure was adjusted by varying the pumping rate. The contour area was established by lowering the cathode half-cell onto work-piece to the limit of its own weight partially counter-balanced by an adjustable coil spring. Contour area was systematically varied by adjusting the tension on the coil spring. De-ionized water (initial conductivity 0.56 mS/cm) was supplied directly to the surface of the work from the de-ionizing unit (Barnstead Nanopure Infinity) at rate of approximately 2 liters/min. Interface velocity v was determined by the combination of the radial position of the contour area and the angular velocity of the turntable. The voltage was supplied between the cathode and the work piece from a programmable DC power supply (Kepco BOP 20-5D). Electrical contact to the work-piece was provided by a metal ring contact its outer edge and a set of slip ring contacts on the shaft of the turntable.

The effects of various operating parameters on current density were measured by polishing with the contour area fixed at a single radial position. Current densities were calculated from the measured current i together with the contour and interface areas measured from static etch patterns obtained immediately after polishing.

For planarization measurements polishing was performed over most of work-piece surface. This was accomplished by programming both the angular velocity of the turntable and radial velocity of the half-cell in such a way that the contour area swept over most of the work piece while maintaining nearly constant values for the interface velocity and integrated residence time of the contour area. The step height of topographic features on the work-piece was measure using a mechanical profilometry (KLA-Tencor Alpha-Step 500).

All embossed membranes used in the examples were prepared from Nafion® N117 membranes in the same manner as described in Example 1 using different metal mesh screens. The area and coverage of the lands were likewise determined in the same manner from static etch patterns.

Example 1

Preparation of a Topographically Patterned Membrane

Figure 3A:
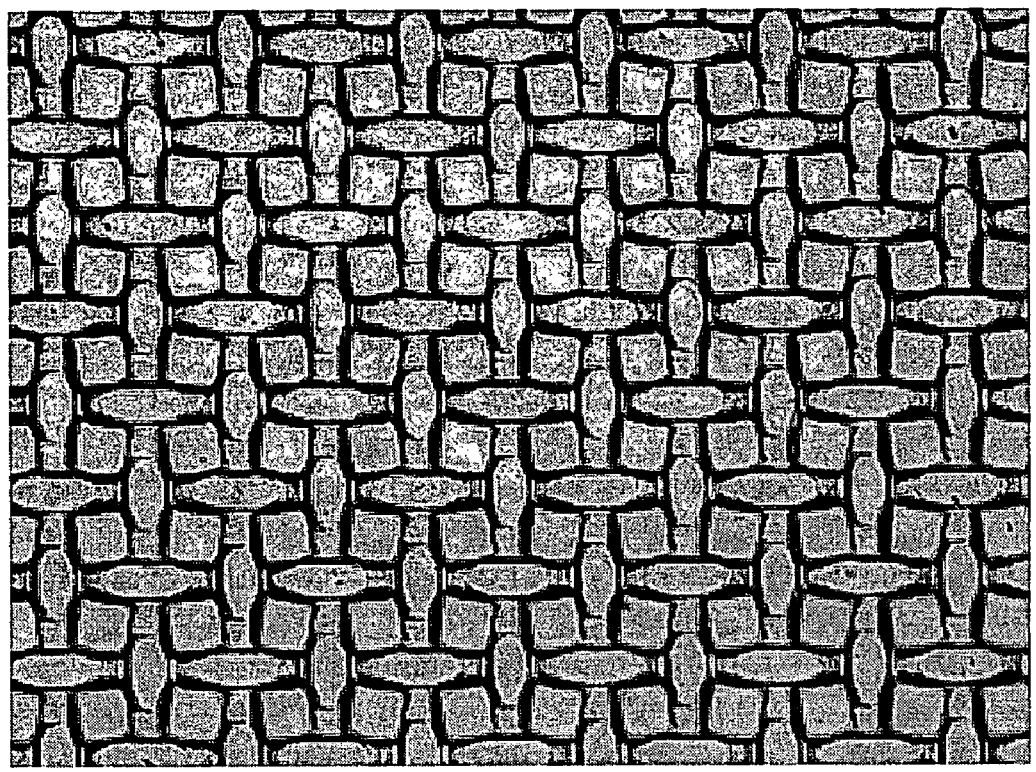
FIG. 3A is a bright field optical micrograph of a membrane embossed by hot-pressing against a screen comprising 0.0045" stainless steel wires in a mesh of 100×100 wires/inch.
Figure 3B:
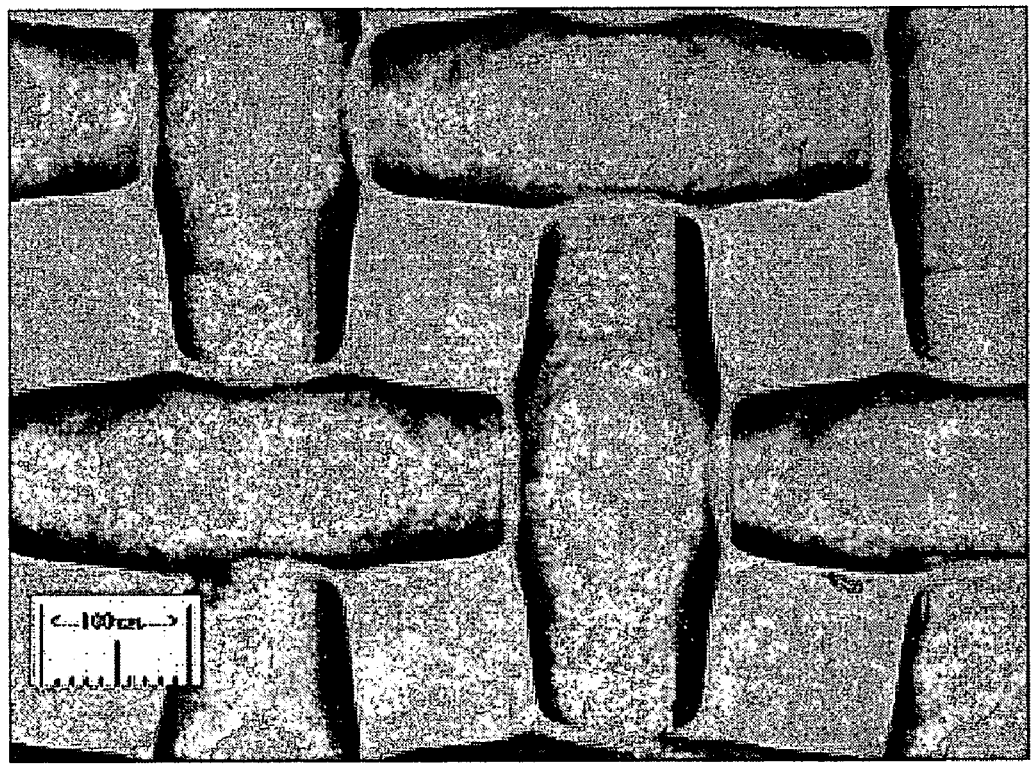
FIG. 3B is an enlarged view of a portion of FIG. 3A.

A topographically patterned membrane was prepared by embossing a smooth flat Nafion® N117 membrane (0.007" thick) using as the embossing tool a wire mesh comprising 0.0045" stainless steel wires woven at 100×100 wires/inch. The wire mesh was first flattened in a hydraulic press at 30,000 psi in order to minimize thickness variations where the wires crossed. The flattened mesh was pressed between two samples of N117 film at approximately 80° C. and 1000 psi, then cooled to ambient temperature before releasing the pressure and separating the films. FIGS. 3A and 3B show optical micrographs of the embossed membrane. The square areas in these micrographs are the projecting lands while the recessed channels are seen as casts of the crossing pattern of wires. FIGS. 4A and 4B show micrographs of the static etch pattern on a Cu work-piece created by the same membrane from which the interfacial area of each land (1.4×10$^{-4}$ cm$^2$) and fractional coverage F$_L$=0.18 were determined.

Example 2

Comparative Performance of Smooth and Embossed Membranes

Data comparing the performance of smooth and topographically patterned membranes are summarized in FIGS. 6-11.

Figure 6:
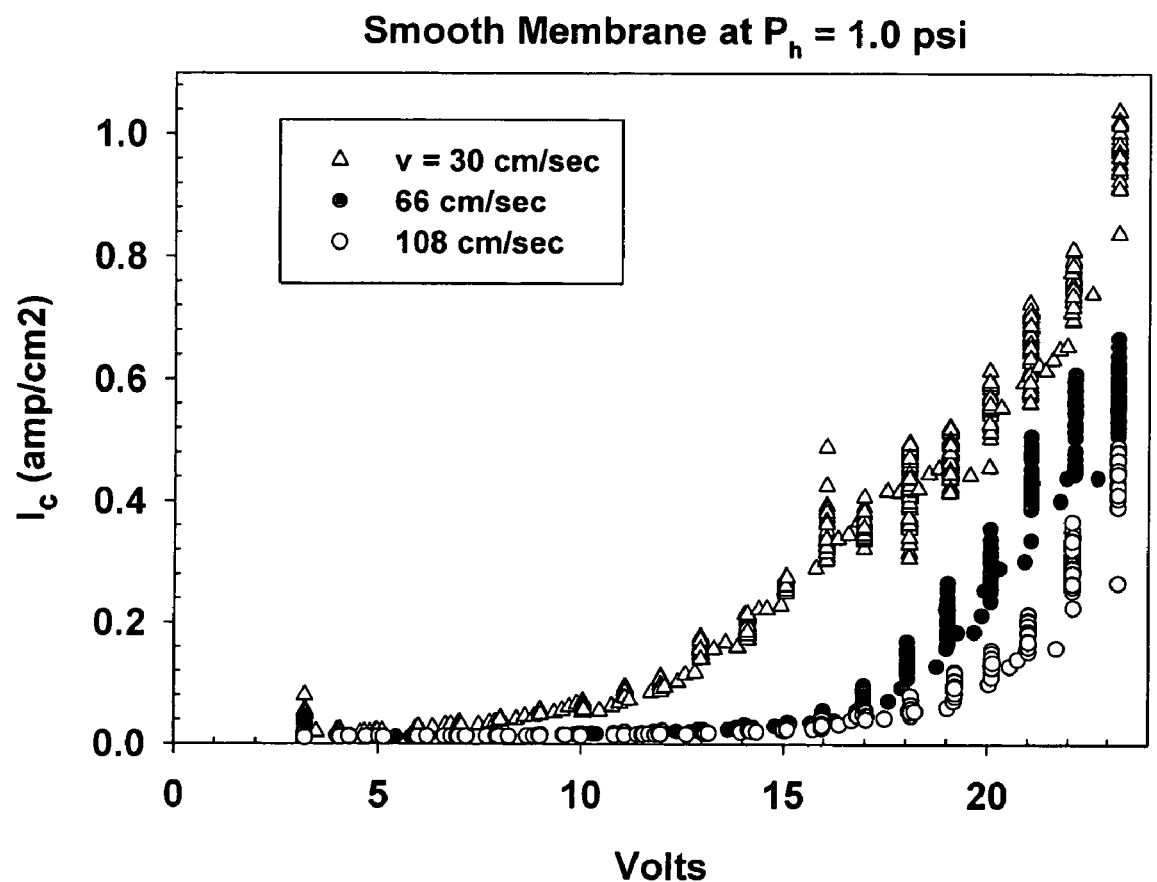
FIG. 6 is a graph of $I_c$ vs. volts showing the effect of interface velocity on the polarization curve for a smooth membrane at constant hydrostatic pressure.
Figure 7:
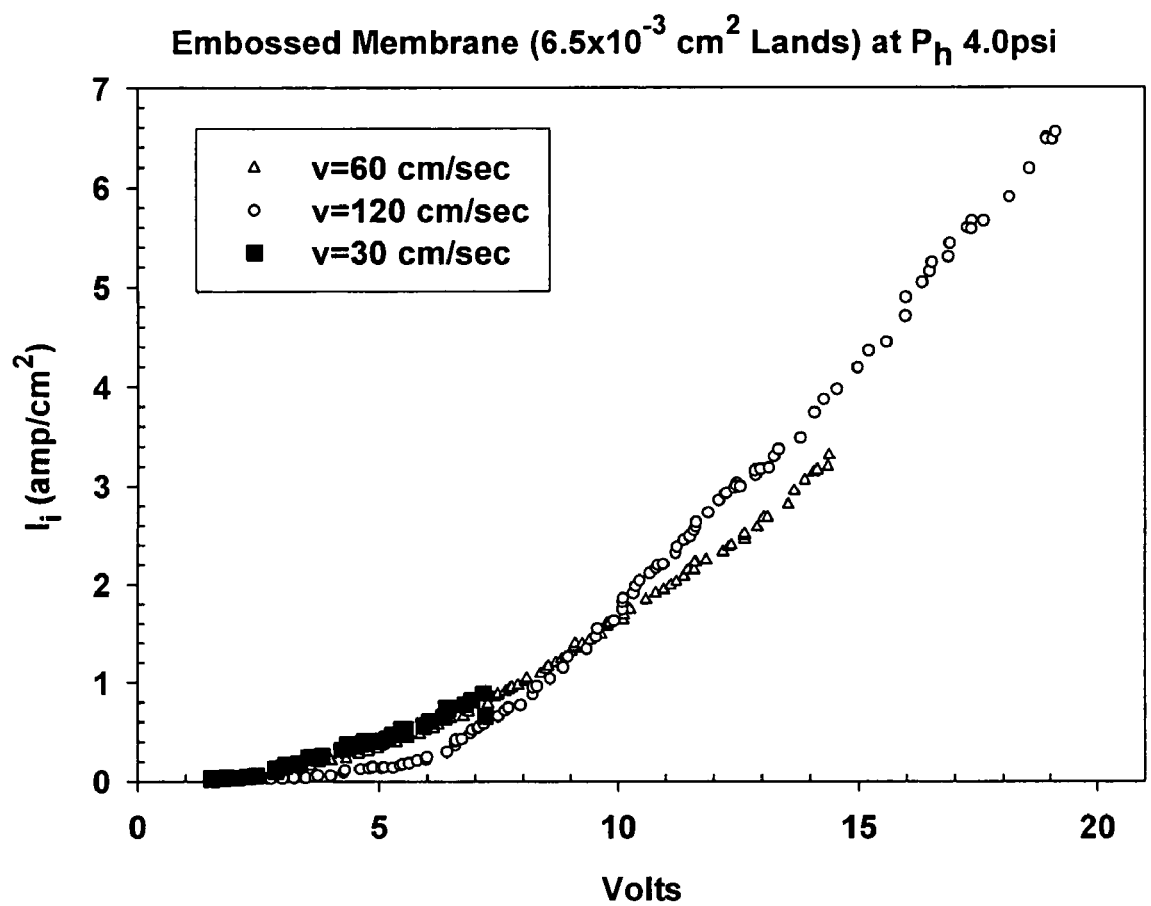
FIG. 7 is a graph of $I_i$ vs. volts showing the effect of interface velocity on the polarization curve for an embossed membrane at constant hydrostatic pressure.

FIGS. 6 and 7 show polarization curves (variations in the steady-state current density with voltage) respectively for smooth and embossed membranes at constant P$_h$ and a range of interface velocities. For applied voltages greater than 2V, the interfacial current density I$_i$ for the embossed membrane is substantially higher than for the smooth membrane and that interface velocity has a strong influence on the smooth membrane but very little on the embossed membrane.

Figure 8:
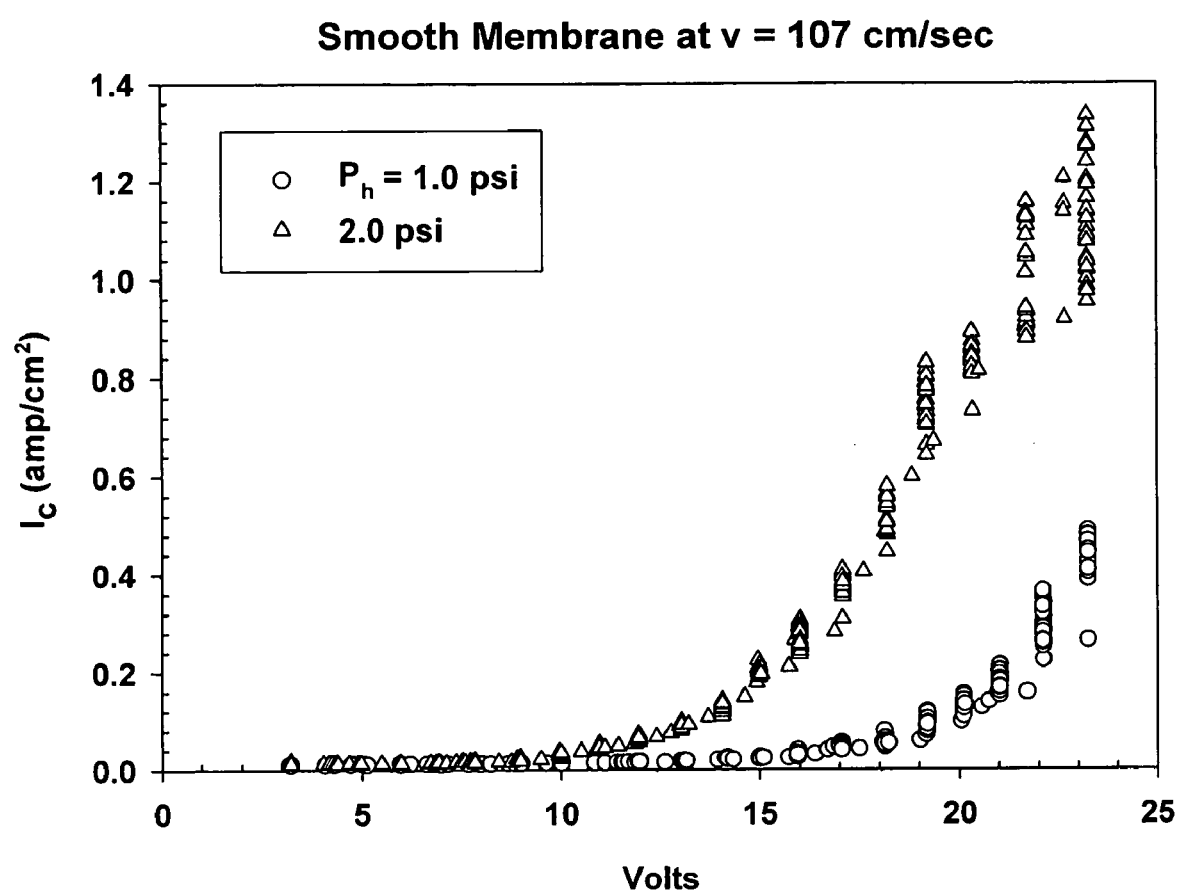
FIG. 8 is a graph of $I_c$ vs. volts showing the effect of hydrostatic pressure on the polarization curve for a smooth membrane at constant interface velocity.
Figure 9:
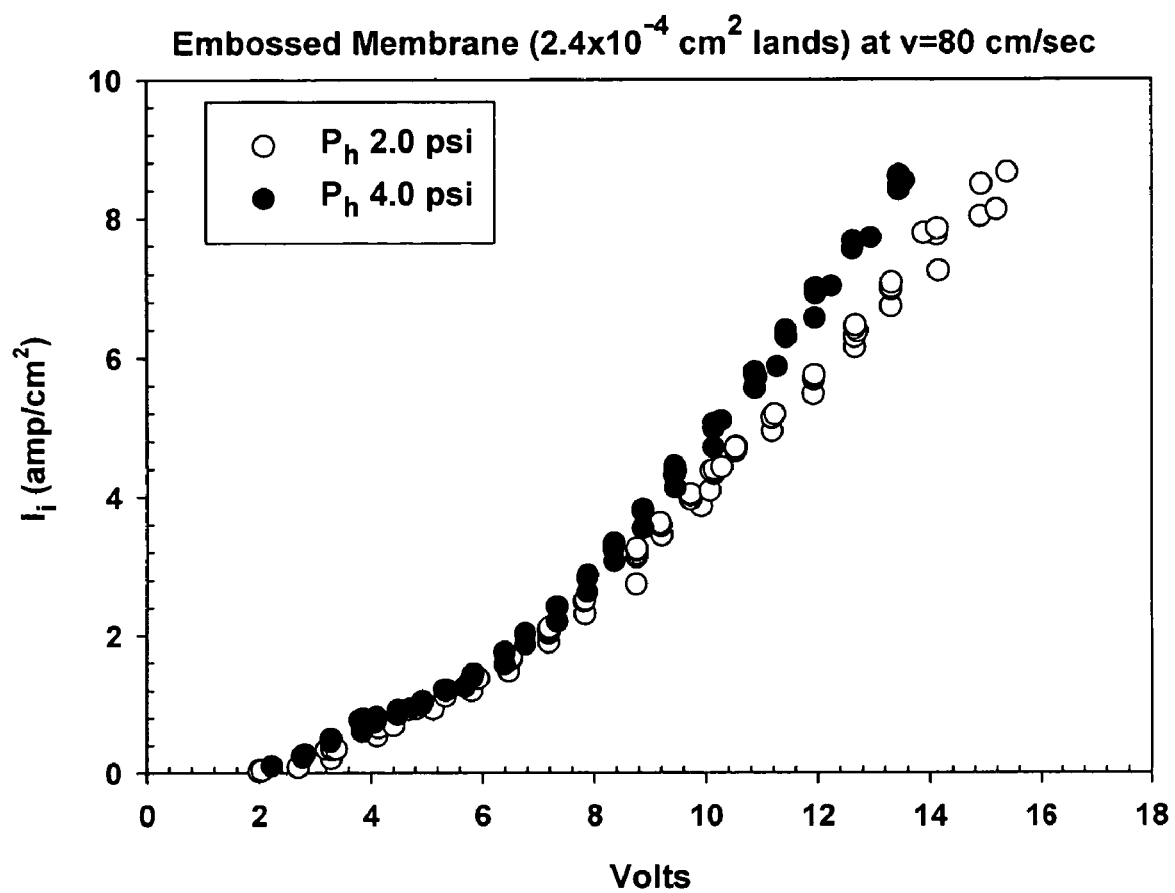
FIG. 9 is a graph of $I_i$ vs. volts showing the effect of hydrostatic pressure on the polarization curve for an embossed membrane at constant interface velocity.

FIGS. 8 and 9 show polarization curves respectively for smooth and embossed membranes at constant v and different values of P$_h$. The embossed membrane provides much higher current density at for applied voltages greater than 2V, and much less sensitivity to P$_h$.

Figure 10:
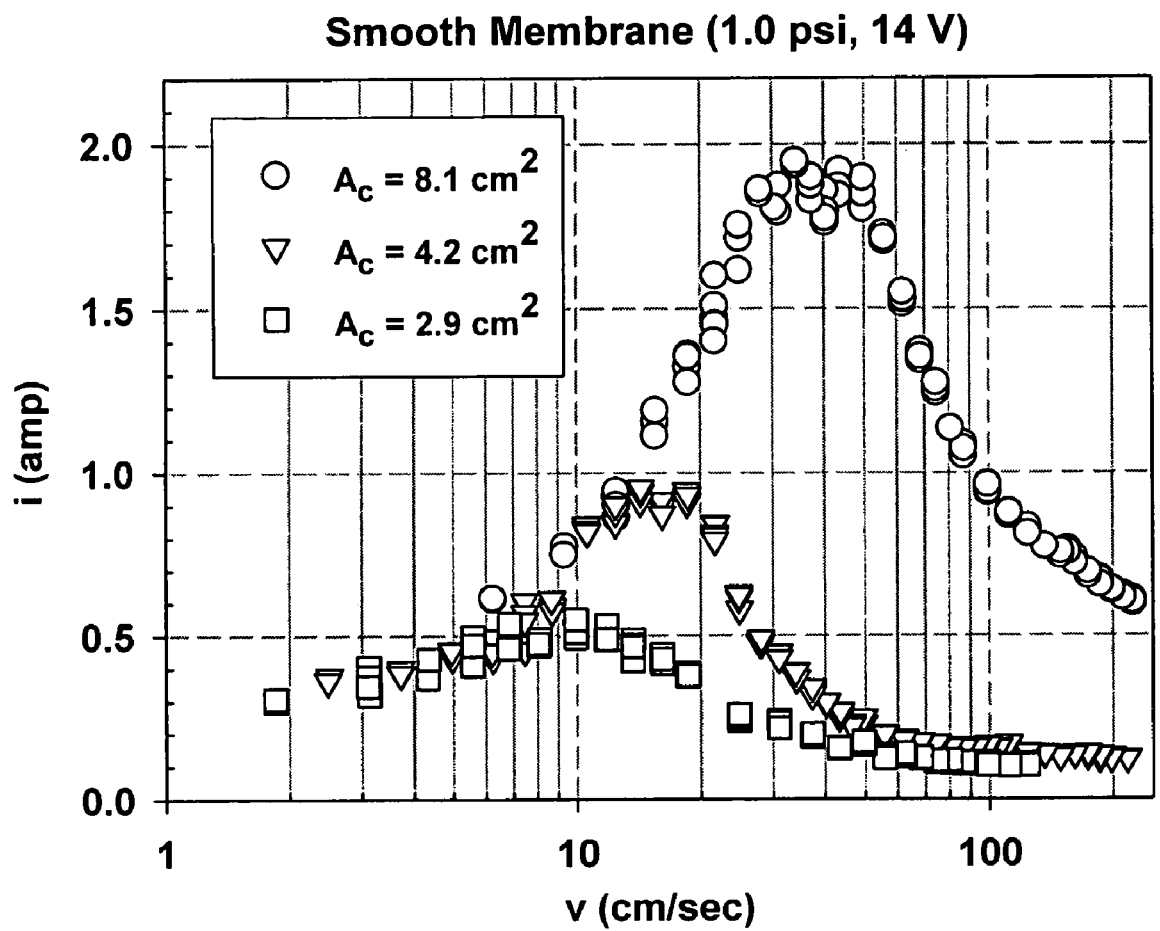
FIG. 10 is a graph of $I_c$ vs. velocity showing the effect of interface velocity on average current density for a smooth membrane at 14.0 V and hydrostatic pressure 1.0 psi.

FIG. 10 shows variations in the net current density i with interface velocity v and contour area A$_c$ for a smooth membrane at 14 V. As v is decreased from 100 cm/sec, i increases and ultimately reaches a maximum or peak value. When v is reduced below this peak value, the current decreases and strong adhesive and/or abrasive forces develop, as evidenced by an audible squeaking sound. At a given voltage, the peak current and onset of squeaking occurs at progressively higher v for larger values of A$_c$. It is believed that the peak current represents the condition at which the hydrodynamic flow of water to the interface is exactly balanced by the electro-osmotic removal of water through the membrane. At velocities below this peak, dehydration causes a decrease in current and increasing friction, whereas at velocities above the peak the current decreases with increasing v due to an increase in thickness and electrical resistance of the interfacial water. These effects are sensitive to A$_c$ because electro-osmotic flow is proportional to A$_c$, whereas the hydrodynamic flow is proportional to the width of the contour area. These data demonstrate that attempts to maximize I$_c$ for a smooth membrane by decreasing v are limited by the size of the contour area and result in non-uniform current distribution.

Figure 11:
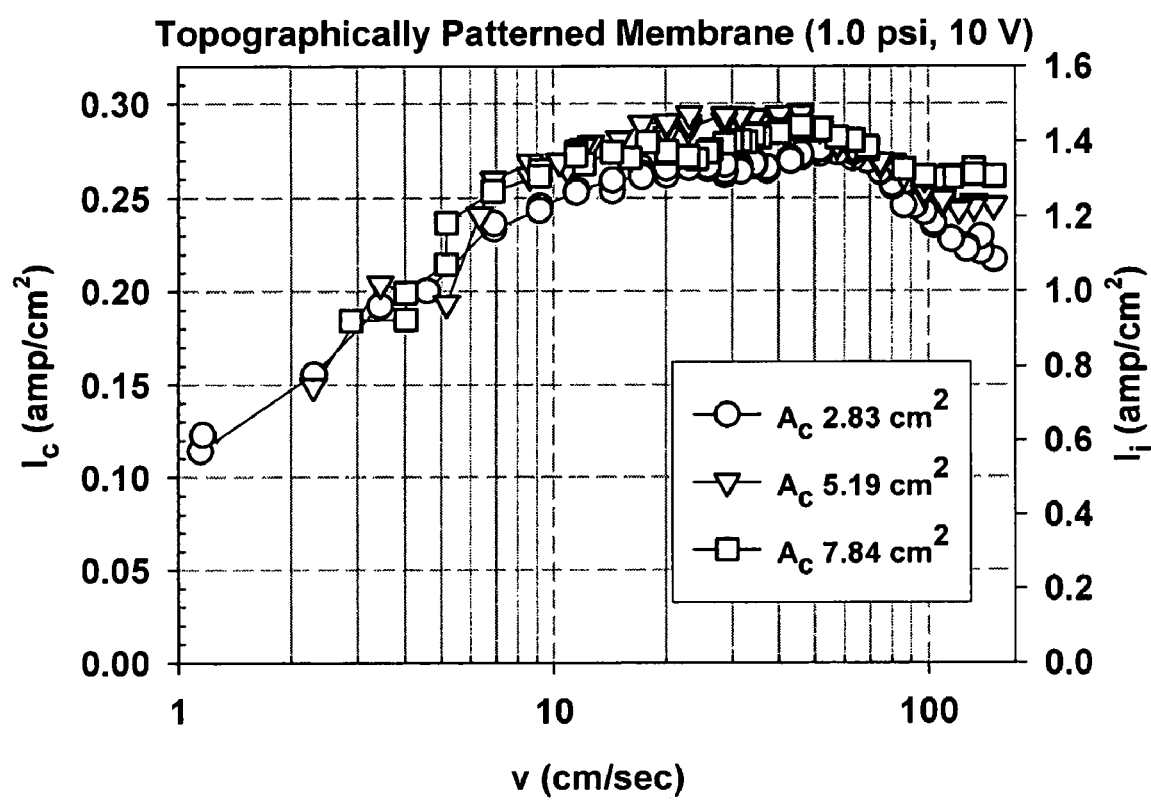
FIG. 11 is a graph of $I_i$ vs. velocity showing the effect of interface velocity on interfacial current density for an embossed membrane at 10 V and hydrostatic pressure 1.0 psi.

For comparison, FIG. 11 shows similar experiments with a topographically patterned membrane comprising small lands with F$_L$=0.2. At v<100 cm/sec, the current is independent of A$_c$, indicating that each land functions independently of its neighbors with respect to electro-osmotic and hydrodynamic flow. While no well-defined peak current is apparent, at v<10 cm/sec the onset of dehydration was indicated by audible squeaking. An important difference from the smooth membrane is the discovery that, within the range from 10 to 80 cm/sec, current density remains high and nearly independent of v. This result can be understood based on differences in the lubrication mechanics for the smooth and topographically patterned membranes. Independent measurements of the thickness δ of the interfacial water layer (for the same range of P$_h$, A$_c$ and v) showed that this layer grows monotonically with v for the smooth membrane, but for the topographically patterned membrane it remains extremely thin (δ≦1 μm) for v<100 cm/sec. The high current density and reduced velocity dependence of the topographically patterned membrane can be attributed to the greatly reduced hydrodynamic pressure of the interfacial water on the lands. The data show that the topographically patterned membrane provides improved performance, as measured by high current density, and also eliminates or greatly reduces the sensitivity of current density to variations in $A_c$ and v.

Example 3

Planarization Efficiency with an Embossed Membrane at High Removal Rate

Figure 12:
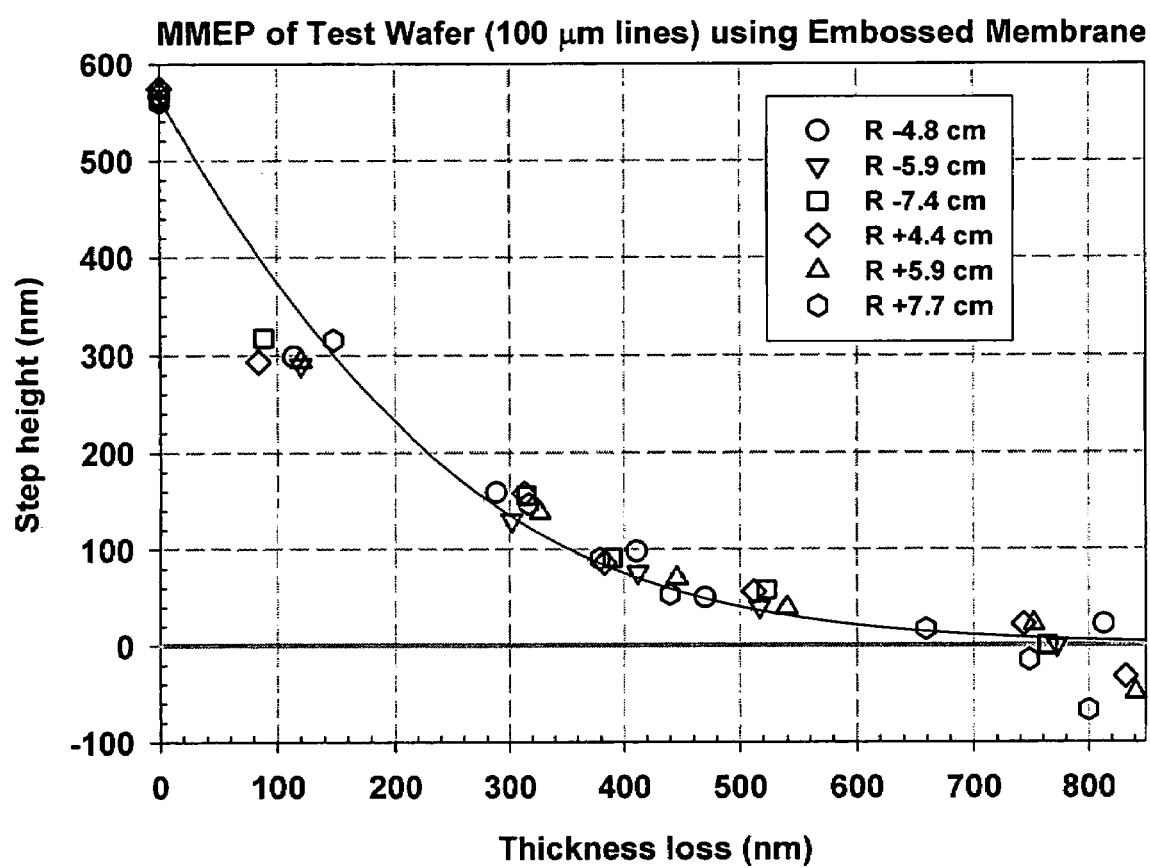
FIG. 12 is a graph of step-height vs. thickness loss showing the planarization of 100 μm lines and spaces on at test wafer (Sematech 854AZ) by MMEP using an embossed membrane with lands of area $2.8 \times 10^{-4}$ cm².

FIG. 12 shows the results of planarizing a Cu damascene test wafer by MMEP using an embossed Nafion® membrane with land areas $2.8 \times 10^{-4}$ cm$^2$ and fractional coverage $F_L$ 0.24. The voltage was pulsed between 0.1 msec at 1V and 0.2 msec at 8 V. The average current density was $I_c \sim 1$ amp/cm$^2$ and n~5 corresponding to an interfacial removal rate within the contour area $RR_c \sim 6$ μm/min. Therefore to achieve RR>1 μm/min over the entire work-piece would require a contour area or plurality of contour areas no greater than 17% of the total area of the work-piece. In FIG. 12 the step height at 100 μm lines and spaces is plotted as a function of the average amount of Cu removed, as determined from sheet resistance measurements and weight loss. The data points represent measurements at 6 different radial positions (designated R) across the surface of the 200 mm wafer. The data show that planarization was highly uniform and complete prior to removal of entire Cu layer.

We claim:

1. A membrane-mediated electropolishing process comprising:
   a. providing a cathode half-cell comprising:
      1. a fully or partially enclosed volume, cavity or vessel;
      2. an electrolyte solution or gel that partially or substantially fills the enclosed volume, cavity or vessel;
      3. an electrode in contact with the electrolyte solution or gel;
      4. a means for electrically connecting the electrode to a DC power source; and
      5. a charge-selective ion-conducting membrane that seals one surface of the enclosed volume, cavity or vessel in such a way that the internal surface of said membrane contacts the electrolyte solution or gel and the external surface is accessible to contact the metal work piece and a low-conductivity solvent or solution, and wherein the membrane is topographically patterned with lands of width $W_L$ and channels of depth $D_C$ situated on the external surface of the membrane, and the channels extend to the edges of the contour area;
   b. substantially covering a surface of a metal work piece with a low-conductivity solvent or solution;
   c. providing a source of DC electrical power whose positive terminal is connected to the metal work piece and whose negative terminal is connected to the electrode in the half-cell; and
   d. contacting the metal work piece with at least a portion of the external surface of the membrane.

2. The process of claim 1, wherein the metal work piece and the membrane of the cathode half-cell are moved relative to each other such that the area of contact of the membrane moves across a surface of the metal work piece.

3. The process of claim 1, wherein the membrane is a cation conducting membrane.

4. The process of claim 3, wherein the membrane comprises a polymeric ionomer functionalized with strong acid groups, wherein the pKa of the acid groups is less than 3.

5. The process of claim 4, wherein the acid groups are sulfonic acid groups.

6. The process of claim 5, wherein the polymeric ionomer is a perfluorosulfonic acid/PTFE copolymer.

7. The process of claim 1, wherein the metal work piece comprises a material selected from silver, nickel, cobalt, tin, aluminum, copper, lead, tantalum, titanium, iron, chromium, vanadium, manganese, zinc, zirconium, niobium, molybdenum, ruthenium, rhodium, hafnium, tungsten, rhenium, osmium, iridium, and alloys thereof, and brass and steel.

8. The process of claim 7, wherein the metal work piece comprises copper.

9. The process of claim 1, wherein the electrolyte has a conductivity of greater than 10 mS/cm.

10. The process of claim 9, wherein the electrolyte further comprises metal salts.

11. The process of claim 10, wherein the metal ions of the metal salt have the same elemental composition and the same oxidation state as the metal ions produced on anodic oxidation of the metal work piece.

12. The process of claim 11, wherein the work piece comprises copper, and the electrolyte comprises copper sulfate in an aqueous solution comprising an acid.

13. The process of claim 12 wherein the acid is selected from sulfuric acid and phosphoric acid.

14. The process of claim 12, wherein the aqueous solution further comprises acetonitrile.

15. The process of claim 1, wherein the low-conductivity solvent has a conductivity of less than 200 mS/cm.

16. The process of claim 13, wherein the low conductivity solvent is water or an aqueous solution.

17. The process of claim 1, wherein the process is conducted at constant voltage.

18. The process of claim 1, wherein the process is conducted at constant current.

19. The process of claim 1, wherein the process is conducted to vary the voltage with time between selected voltage values.

20. The process of claim 1, wherein the process is conducted to vary the current with time between selected current values.

21. An apparatus for use in membrane-mediated electropolishing of a metal work piece, comprising:
   a. a DC electric power source;
   b. a means for electrically connecting the work piece to the positive terminal of the DC electric power source;
   c. an electrolyte solution or gel;
   d. a low conductivity solvent or solution in contact with the membrane and the work piece;
   e. a charge-selective ion-conducting membrane that seals one surface of the enclosed volume, cavity or vessel in such a way that the internal surface of said membrane contacts the electrolyte solution or gel and the external surface is accessible to contact the metal work piece and a low-conductivity solvent or solution, and wherein the membrane is topographically patterned with lands of width $W_L$ and channels of depth $D_C$ situated on the external surface of the membrane, and the channels extend to the edges of the contour area;
   f. a cathode in contact with the electrolyte solution or gel;
   g. a means for connecting the cathode to the negative terminal of the DC electric power source; and
   h. a means for moving the membrane in contact with the work piece and the low-conductivity solvent or solution along the surface of the work piece.

22. A cathode half-cell for use in membrane-mediated electropolishing, comprising:

a. a fully or partially enclosed volume, cavity or vessel;
b. an electrolyte solution or gel that partially or substantially fills the enclosed volume, cavity or vessel;
c. an electrode in contact with the electrolyte solution or gel;
d. a charge-selective ion-conducting membrane that seals one surface of the enclosed volume, cavity or vessel such that the internal surface of said membrane contacts the electrolyte solution or gel and the external surface is accessible to contact the metal work piece and a low-conductivity solvent or solution, and wherein the membrane is topographically patterned with lands of width $W_L$ and channels of depth $D_C$ situated on the external surface of the membrane, and the channels extend to the edges of the contour area.

* * * * *